(12) United States Patent
Kawaguchi et al.

(10) Patent No.: US 8,571,704 B2
(45) Date of Patent: Oct. 29, 2013

(54) SUBSTRATE TRANSFER APPARATUS

(75) Inventors: Takafumi Kawaguchi, Chigasaki (JP); Kenji Ago, Chigasaki (JP); Toshio Koike, Chigasaki (JP)

(73) Assignee: ULVAC, Inc. (JP)

( * ) Notice: Subject to any disclaimer, the term of this patent is extended or adjusted under 35 U.S.C. 154(b) by 764 days.

(21) Appl. No.: 12/528,703

(22) PCT Filed: Feb. 27, 2008

(86) PCT No.: PCT/JP2008/053375
§ 371 (c)(1),
(2), (4) Date: Aug. 26, 2009

(87) PCT Pub. No.: WO2008/105444
PCT Pub. Date: Sep. 4, 2008

(65) Prior Publication Data
US 2010/0121487 A1 May 13, 2010

(30) Foreign Application Priority Data
Feb. 28, 2007 (JP) ................................. 2007-050039

(51) Int. Cl.
*H01L 21/677* (2006.01)
(52) U.S. Cl.
USPC ........... 700/228; 414/783; 414/816; 382/149; 348/87
(58) Field of Classification Search
USPC ........................................................ 700/228
See application file for complete search history.

(56) References Cited

U.S. PATENT DOCUMENTS

| 5,054,991 A | * | 10/1991 | Kato | 414/783 |
| 6,697,517 B1 | * | 2/2004 | Hunter | 382/149 |
| 2003/0202092 A1 | * | 10/2003 | Sadighi et al. | 348/87 |
| 2006/0287761 A1 | | 12/2006 | Ishizawa | |
| 2008/0152474 A1 | * | 6/2008 | Scholte Van Mast et al. | 414/816 |

FOREIGN PATENT DOCUMENTS

| JP | 64-048443 | 2/1989 |
| JP | 06-224284 | 8/1994 |
| JP | 2003-165078 | 6/2003 |
| JP | 2006-351883 | 12/2006 |

OTHER PUBLICATIONS

International Search Report PCT Application No. PCTJP/2008/053375 dated Mar. 25, 2008.
International Preliminary Report on Patentability and Written opinion of the International Searching Authority for corresponding PCT Application No. PCTJP/2008/053375 dated Sep. 1, 2009.

* cited by examiner

*Primary Examiner* — Gene Crawford
*Assistant Examiner* — Kyle Logan
(74) *Attorney, Agent, or Firm* — Caesar, Rivise, Bernstein, Cohen & Pokotilow, Ltd.

(57) ABSTRACT

A substrate transfer apparatus that reduces the quantity of sensors used to detect the position of a substrate so as to simplify the structure and lower costs. The substrate transfer apparatus transfers a substrate (S) between a core chamber (11) and a peripheral chamber (12 or 13). A transfer robot (15) is arranged in the core chamber. The transfer robot includes a hand (17) for carrying the substrate and is capable of extending/drawing and pivoting the hand. A sensor (19) detects an edge surface of the substrate. The sensor is arranged at a position that the edge surface of the substrate passes by when the hand is extended/drawn between the core chamber and the peripheral chamber and that the edge surface of the substrate passes by when the hand is pivoted in the core chamber.

10 Claims, 6 Drawing Sheets

SUBSTRATE TRANSFER APPARATUS

CROSS-REFERENCE TO RELATED APPLICATIONS

This national stage application claims the benefit under 35 U.S.C. §371 of International Application No. PCT/JP2008/053375 filed on Feb. 27, 2008, entitled SUBSTRATE TRANSFER APPARATUS, which in turn takes its priority from JP Application Serial No. 2007-050039 filed on Feb. 28, 2007.

TECHNICAL FIELD

The present invention relates to a substrate transfer apparatus.

BACKGROUND ART

To improve productivity, an apparatus for fabricating semiconductor devices employs a system in which a plurality of processing chambers are connected to a single core chamber, namely a cluster-type system.

A core chamber is generally a regular polygonal structure, the faces of which are connected to processing chambers. A transfer robot is installed in the core chamber to transfer wafers. The transfer robot is arranged on the axis of the core chamber to transfer wafers to each one of the processing chambers. The transfer robot includes a hand, which supports a wafer. The hand is moved in a circumferential direction ($\theta$ direction) of a circumscribing circle of the core chamber and a radial direction (R direction). A wafer accommodated in a load lock chamber is supported by the hand of the transfer robot and transferred into a processing chamber by an R-$\theta$ plane action of the hand.

In a cluster system, to obtain high reproducibility for the processing state of each processing chamber, it is important that wafers be accurately transferred to each processing chamber. The transfer robot is also required to detect the position of a wafer during a wafer transfer process and correct the transfer state of the wafer based on the detection result. For an apparatus that fabricates semiconductor devices, detection of the center of the wafer during the transfer process has been proposed in the prior art to improve the transfer accuracy of the wafer.

Patent document 1 discloses the arrangement of a sensor array, which includes a plurality of sensors, for example, three sensors, in a core chamber. Each sensor is set along an axis that traverses a movement route of a wafer in the R direction. Each sensor in the sensor array detects an edge surface of a wafer as a sensor trigger point and generates an output signal indicating the position of the wafer in relation with the sensor trigger point. The transfer robot calculates the location of a wafer center relative to a target point in response to three output signals from the sensor array so as to align the wafer center with a target point. In this manner, the position of the wafer is detected during a loading-unloading operation of the wafer. Thus, position information of the wafer is accurately obtained without stopping the movement of the transfer robot.

In patent document 2, each sensor of a sensor array is arranged along an axis that transverses a movement route of a wafer in the $\theta$ direction. Each sensor in the sensor array detects an edge surface of a wafer as a sensor trigger point and generates an output signal indicating the position of the wafer in relation with the sensor trigger point. As a result, the sensor array may detect the edge surface of a wafer without the need for separately performing a loading-unloading operation of the wafer. This obtains position information in an easier manner.

Patent documents 1 and 2 both require a plurality of sensors arranged along an axis traversing the movement route of a wafer. This is because during detection of an edge surface of the wafer, the wafer serving as the detection subject is moved in only one direction (the R direction or the $\theta$ direction). Further, a single sensor and two detection points on the edge surface detected by the sensor must all be located along a straight line in the movement direction of the wafer.

Specifically, in patent document 1, the sensor and the two detection points detected by the sensor are arranged along a straight line in the R direction. Thus, to obtain the required detection accuracy, a different detection point must also be set in at least a direction traversing the R direction. Accordingly, a plurality of sensors are necessary when moving a wafer in the R direction. In patent document 2, the sensor and the two detection points detected by the sensor are arranged in the $\theta$ direction. However, the pivoting radius of the hand is much greater than the substrate radius. Thus, the sensor and the corresponding two detection points are substantially located on a generally straight line when entirely viewing a substrate.

Accordingly, in patent documents 1 and 2, when correcting the position of the wafer for each processing chamber, the quantity of the sensors must be in correspondence with the quantity of the processing chambers. For example, when three sensors are required for a single processing chamber, twenty-four sensors are required for a cluster system including eight processing chambers.

As a result, patent documents 1 and 2 greatly increase the number of components in the fabrication apparatus. This causes the apparatus structure to be complicated and increases costs.

Patent Document 1: Japanese Examined Patent Publication No. 7-27953

Patent Document 2: Japanese Laid-Open Patent Publication No. 6-224284

SUMMARY OF THE INVENTION

One aspect of the present invention provides a substrate transfer apparatus that reduces the quantity of sensors used to detect the position of a substrate so as to simplify the structure and lower costs.

A first aspect of the present invention is a substrate transfer apparatus. The substrate transfer apparatus transfers a substrate between a core chamber and a peripheral chamber and includes a transfer robot arranged in the core chamber and capable of extending/drawing and pivoting a hand for carrying the substrate. A sensor detects an edge surface of the substrate. The sensor is arranged at a position that the edge surface of the substrate passes by when the hand is extended/drawn between the core chamber and the peripheral chamber and that the edge surface of the substrate passes by when the hand is pivoted in the core chamber.

A second aspect of the present invention is a substrate transfer apparatus. The substrate transfer apparatus transfers a substrate from an initial point to a terminal point and is provided with a transfer robot including an arm, which has a pivot shaft, and a hand, which is connected to the arm and which supports the substrate. The transfer robot is capable of extending/drawing the hand along a radial direction of the pivot shaft and capable of pivoting the hand about the pivot shaft. A sensor detects an edge surface of the substrate at a first detection point associated with the initial point. A control unit controls the sensor and the transfer robot. The control unit sets a route for the hand so as that a first selection point, located on the edge surface of the substrate in a first direction in which the hand is extended/drawn, and a second selection point, located on the edge surface of the substrate in a second direction in which the hand is pivoted, pass by the first detection point. The control unit also drives the transfer robot and moves the hand from the initial point along the route, detects the first selection point and the second selection point with the sensor at the first detection point, calculates the location of the center of the substrate based on the detection result, and transfers the substrate to the terminal point based on the calculation result.

DETAILED DESCRIPTION OF THE PREFERRED EMBODIMENTS

First Embodiment

Figure 1:
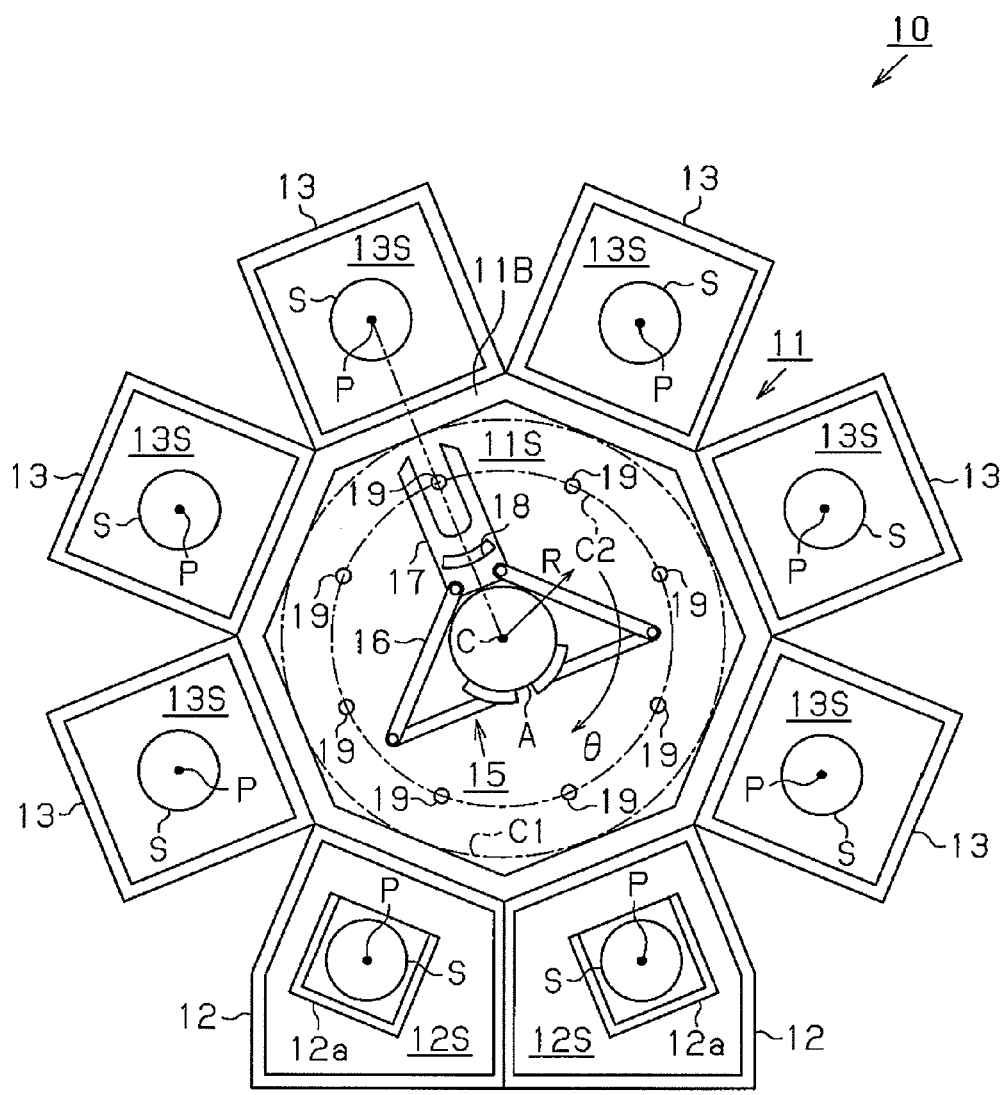
FIG. 1 is a schematic plan view showing a substrate transfer apparatus.
Figure 2A:
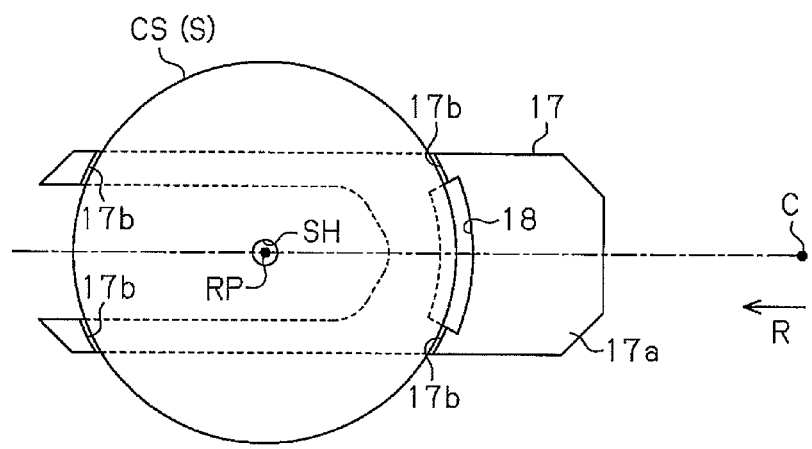
FIGS. 2(a) and 2(b) are respectively a plan view and a cross-sectional side view showing a hand of FIG. 1.
Figure 2B:
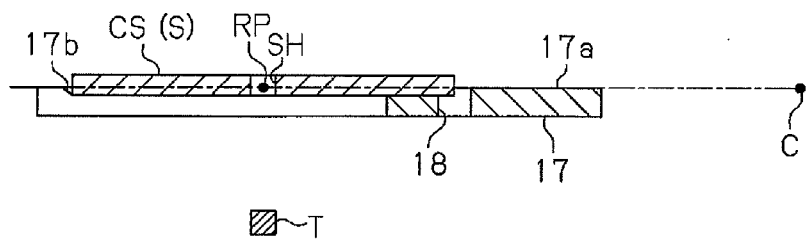
Figure 3A:
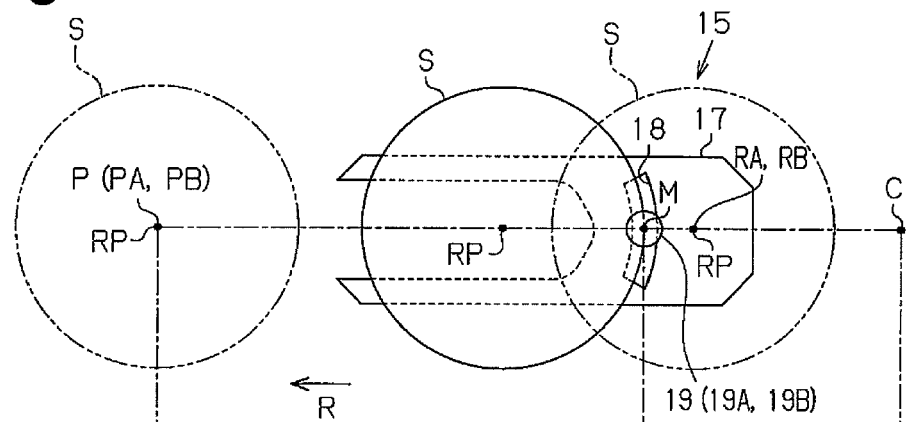
FIGS. 3(a) and 3(b) are respectively a plan view and a cross-sectional side view showing a sensor of FIG. 1.
Figure 3B:
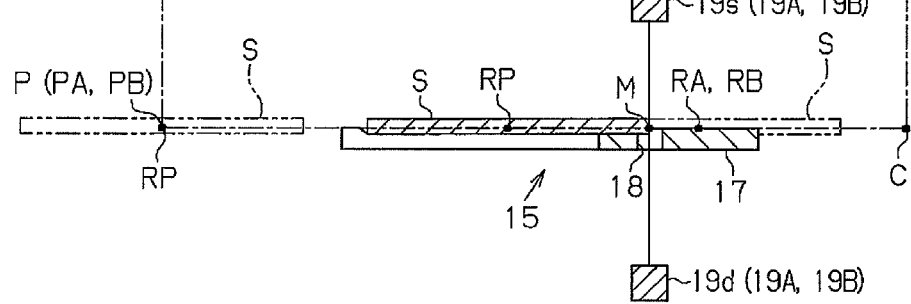

A first embodiment of a substrate transfer apparatus according to the present invention will now be discussed. A semiconductor device fabrication apparatus 10 serving as a substrate transfer apparatus will first be described. FIG. 1 is a schematic plan view showing the fabrication apparatus in a vertical direction. FIGS. 2(a) and 2(b) are respectively a plan view and a cross-sectional side view showing a hand 17 of a transfer robot 15 of FIG. 1. FIGS. 3(a) and 3(b) are respectively a plan view and a cross-sectional side view showing a sensor 19.

With reference to FIG. 1, the fabrication apparatus 10 includes a core chamber 11, two load lock chambers (hereinafter simply referred to as LL chambers) 12 connected to the core chamber 11, and six processing chambers 13 connected to the core chamber 11. The LL chambers 12 and the processing chambers 13 serve as peripheral chambers that are connectable to the core chamber 11.

The core chamber 11 includes a chamber body 11B, which is shaped as a regular octagonal structure and has a closed bottom. The chamber body 11B has an interior defining an internal cavity (hereinafter simply referred to as a transfer compartment 11S), which is a regular octagonal void having an inscribed circle C1. The center of the inscribed circle C1 is the center point C of the chamber body 11B. The chamber body 11B has an upper end covered by a chamber lid (not shown) to maintain the transfer compartment 11S in a vacuum state.

The LL chambers 12 each include an internal cavity (hereinafter simply referred to as an accommodation compartment 12S) in which a vacuum state is sustainable. Each accommodation compartment 12S includes a cassette 12a, in which a plurality of substrates S are retainable. The cassette 12a includes slots, each of which accommodates a single substrate S. The substrate S is, for example, a circular silicon wafer or ceramic substrate and has a diameter of which is known in the art. Each LL chamber 12 connects the corresponding accommodation compartment 12S to the transfer compartment 11S in a disconnectable manner, allows for the substrates S accommodated in the cassette 12a to be loaded out into the transfer compartment 11S, and allows for the substrates S in the core chamber 11 to be loaded into the accommodation compartment 12S.

The processing chambers 13 each include an internal cavity (hereinafter simply referred to as a processing compartment 13S) in which a vacuum state is sustainable. Each processing chamber 13 includes a substrate stage (not shown) in the processing compartment 13S to perform various types of processing such as heat processing or film formation processing. Each processing chamber 13 connects the corresponding processing compartment 13S to the transfer compartment 11S in a disconnectable manner, allows for the substrates S in the core chamber 11 to be loaded into the processing compartment 13S, and allows for the substrates S that have undergone predetermined processing to be loaded out into the transfer compartment 11S.

A transfer point P is defined in each accommodation compartment 12S and each processing compartment 13S. The transfer points P are each set along a two-dimensional plane including the inscribed circle C1 (hereinafter simply referred to as the "transfer plane"). Further, these transfer points form a group of points in a polar coordinate (circular polar coordinate) system, the origin point of which is the center point C. The transfer point P is the position at which the center of the substrate S is arranged. When the center of a substrate S is arranged at the transfer point P, a processing operation is performed on the substrate S with high reproducibility.

A transfer robot 15, which transfers the substrates S, is installed in the central part of the transfer compartment 11S. The transfer robot 15 is an R-θ robot including a pivot shaft A, which extends in a vertical direction, an arm 16, which is pivotal about the pivot shaft A and movable in the radial direction of the pivot shaft A, and a hand 17, which is connected to the arm 16.

The arm 16 is drivably connected to two stepper motors (hereinafter simply referred to as motor M1 and motor M2) by means of the pivot shaft A. When the motors M1 and M2 produce rotation in the same direction, the arm 16 moves the hand 17 along the radial direction of the pivot shaft A (hereinafter simply referred to as the radial direction R) along the polar coordinates of which the origin point is the center point C. When the motors M1 and M2 produce rotation in reverse directions, the arm 16 pivots the hand 17 in the pivotal direction of the pivot shaft A (hereinafter simply referred to as pivotal direction θ along the polar coordinates of which the origin point is the center point C. In other words, when the motors M1 and M2 are driven to produce rotation, the hand 17 generates an R-θ plane action and moves the hand 17 along the transfer plane.

The radial direction R is a reciprocative direction extending in the radial direction of the pivotal shaft A. The pivotal direction θ is a reciprocative direction extending in the circumferential direction of the pivotal shaft A.

Referring to FIG. 2, the hand 17, which is formed to be prong-shaped and extended in the radial direction R, includes an upper surface 17a from which four arcuate guides 17b project upward. The guides 17b are formed along the same circle, guide the edge surface of a substrate S supported on the upper surface 17a to a predetermined area, and prevent displacement of the substrate S.

The center of a concentric circle defined by the guides 17b is defined as a hand point RP. A region in the hand 17 that is in the concentric circle defined by the guides 17b is referred to as a pocket. When a substrate S is accommodated in the pocket and the center of the substrate S is aligned with the hand point RP, the hand 17 stabilizes the position of the substrate S relative to the hand 17 and prevents displacement of the substrate S during a transfer process.

The upper surface 17a of the hand 17 includes an arcuate cutaway portion 18, which extends through the hand 17 in the vertical direction near the guides 17b located at the side closer to the center point C. When the hand 17 supports a substrate S, the cutaway portion 18 allows for visual recognition of the corresponding edge surface of the substrate S in the vertical direction. Thus, with regard to the edge surface (circumferential surface) of the substrate S, the hand 17 allows for visual recognition of each region lying in the radial direction R and in the pivotal direction θ.

The center point C and each transfer point P are taught to the transfer robot 15 through a known teaching process. For example, the transfer robot 15 uses a calibration substrate CS, which is shown in FIG. 2, to recognize the center point C and each transfer point P. A through hole SH having a predetermined diameter (e.g., 1 mm) extends through the center of the calibration substrate CS. When the calibration substrate CS is supported by the hand 17, the location of the hand point RP, which is hypothetically determined, is physically determined by arranging the through hole SH in correspondence with the hand point RP.

The transfer robot 15 moves the hand 17 in a state supporting the calibration substrate CS so that a teaching portion T (refer to FIG. 2(b)), which is for directly determining the center point C, corresponds to the through hole SH. The teaching portion T may be formed, for example, by a calibration projection or recess arranged in the core chamber 11. When the through hole SH is located immediately above the teaching portion (of the core chamber 11), that is, when the hand point RP is arranged in correspondence with the center point C, the position of the arm 16 is stored in the transfer robot 15 based on the number of steps of the motors M1 and M2. In this manner, the transfer robot 15 recognizes the center point C, that is, the origin point of the polar coordinates.

Further, the transfer robot 15 moves the hand 17 in a state supporting the calibration substrate CS so that the through hole SH is arranged in correspondence with a teaching portion T, which directly determines a transfer point P. The teaching portion T may be formed, for example, by a calibration projection or recess arranged on a substrate stage. When the through hole SH is arranged immediately above the teaching portion T (of the substrate stage), that is, when the hand point RP is aligned with a transfer point P, the position of the arm 16 is stored in the transfer robot 15 based on the number of steps of the motors M1 and M2. In this manner, the transfer robot 15 recognizes the polar coordinates of the transfer points P.

The center point C and the transfer points P are taught to the transfer robot 15 as described above. This allows the hand 17 to transfer the substrate S so that the hand point RP becomes aligned with a point set in the polar coordinate system, that is, a transfer point P. Accordingly, when the substrate S is not displaced or when the position of the substrate S is corrected, the center of the substrate S may be arranged on the set transfer point P.

In each LL chamber 12, a substrate S that is set in the cassette 12a is not positioned with its center aligned with the transfer point P of the LL chamber 12. That is, the center of the substrate S is displaced from the transfer point P of the LL chamber 12. If the hand 17 were to transfer the substrate S without correcting the displacement, the center of the substrate S would be misaligned from the transfer point P to which the substrate S is transferred. This varies the processing characteristics in accordance with the amount the center of the substrate S is displaced from the transfer point P of the processing compartment 13S.

Further, in each processing chamber 13, when transferred from the substrate stage to the hand 17, a substrate S that has undergone processing may be displaced. That is, even a processed substrate S may be transferred in a state in which its center is displaced from the hand point RP. When such a substrate S is loaded into the LL chamber 12 without correcting the displacement, the substrate S may not be smoothly inserted into the predetermined slot.

Referring to FIG. 1, the core chamber 11 includes a plurality of sensors 19 used to correct the displacement described above. The sensors 19 are arranged along a concentric circle, the center of which is the center point C (hereinafter simply referred to as a detection circle C2). Each sensor 19 is arranged in correspondence with one of the transfer points P. More specifically, in FIG. 1, eight sensors 19 are arranged along the detection circle C2.

Referring to FIG. 3, each sensor 19 is arranged along a straight line connecting the corresponding transfer point P and the center point C. When the hand 17 is located closest to the center point C, the sensor 19 is located at a position facing toward the region of the pocket in the hand 17, that is, the region of the substrate S supported by the hand 17 (in the state shown by the right circle indicated by double-dash lines in FIG. 3).

The transfer point P from which a transfer originates is referred to as an initial point PA, and the transfer point P to which a transfer is destined is referred to as a terminal point PB. Further, the position of the hand point RP in a state in which the hand 17 is arranged at a point between the initial point PA and the center point C that is the location closest to the center point C is referred to as a drawn point RA. The position of the hand point RP in a state in which the hand 17 is arranged at a point between the terminal point PA and the center point C that is the location closest to the center point C is referred to as a delivery point RB. The sensor 19 arranged along a straight line connecting the initial point PA and the drawn point RA is referred to as a movement start sensor 19A, and the sensor 19 arranged along a straight line connecting the terminal point PB and the delivery point RB is referred to as a movement end sensor 19B.

Each sensor 19 is an optical ON/OFF sensor and includes an emission unit 19s and a light reception unit 19d, which are arranged on opposite sides of a transfer surface. The emission unit 19s is arranged above the transfer surface and emits a laser beam in a vertical direction. The light reception unit 19d is arranged in the vertical direction of the emission unit 19s to receive the laser beam from the emission unit 19s. The sensor 19 is activated when the laser beam between the emission unit 19s and the light reception unit 19d is blocked by the substrate S. The sensor 19 is deactivated when the laser beam between the emission unit 19s and the light reception unit 19d is not blocked by the substrate S. When switched from a deactivated state to an activated state or from an activated state to a deactivated state, the sensor 19 detects whether or not the edge surface of the substrate S is located on an optical axis of the laser beam.

The intersection point of the optical axis of each sensor 19 and the transfer surface is referred to as a sensor point M. In the same manner as the transfer points P, each sensor point M is taught to the transfer robot 15 through a known teaching process. For example, the transfer robot 15 first moves the hand 17 to the vicinity of a sensor 19 in a state supporting the calibration substrate CS. Then, the transfer robot 15 alternately repeats pivoting of the hand 17 over a predetermined pivoting angle and straight linear movement (forward and rearward movement) of the hand over a predetermined distance. When the laser beams of the sensor 19 travels through the through hole SH, that is, when the hand point RP is aligned with the sensor point M, the position of the arm 16 is stored in the transfer robot 15 based on the number of steps of the motors M1 and M2. In this manner, the transfer robot 15 recognizes the polar coordinates of the corresponding sensor point M.

When the transfer robot 15 transfers the substrate S from the initial point PA (in the state shown by the left circle indicated by double-dash lines in FIG. 3) to the drawn point RA, the hand point PA moves fourth along a straight line connecting the initial point PA and the drawn point RA. During this movement, the hand 17 relatively moves the sensor point M of the movement start sensor 19A (i.e., laser beam) from the edge surface of the substrate S on the cutaway portion 18 to a region in the substrate S. This switches the movement start sensor 19A from a deactivated state to an activated state. The hand 17 keeps the sensor point M within the region of the substrate S and maintains the activated state of the movement start sensor 19A until the hand point RP reaches the drawn point RA. That is, when transferring the substrate S from the initial point PA to the drawn point RA, the transfer robot 15 selects a single point (hereinafter simply referred to as a first movement start selection point) on the edge surface in the radial direction R from the center of the substrate S and detects the coordinates of the first movement start selection point with the movement start sensor 19A.

When the transfer robot 15 transfers the substrate S from the delivery point RB (in the state shown by the left circle indicated by double-dash lines in FIG. 3) to the terminal point PB, the hand point PA moves fourth along a straight line connecting the delivery point RB and the terminal point PB. During this movement, the hand 17 relatively moves the sensor point M of the movement end sensor 19B (i.e., laser beam) away from the edge surface of the substrate S on the cutaway portion 18 and switches the movement end sensor 19B from an activated state to a deactivated state. The hand 17 keeps the substrate S away from the sensor point M and maintains the deactivated state of the movement end sensor 19B until the hand point RP reaches the terminal point PB. That is, when transferring the substrate S from the delivery point RB to the terminal point PB, the transfer robot 15 selects a single point (hereinafter simply referred to as a first movement end selection point) on the edge surface in the radial direction R from the center of the substrate S and detects the coordinates of the first movement end selection point with the movement end sensor 19B.

Figure 4:
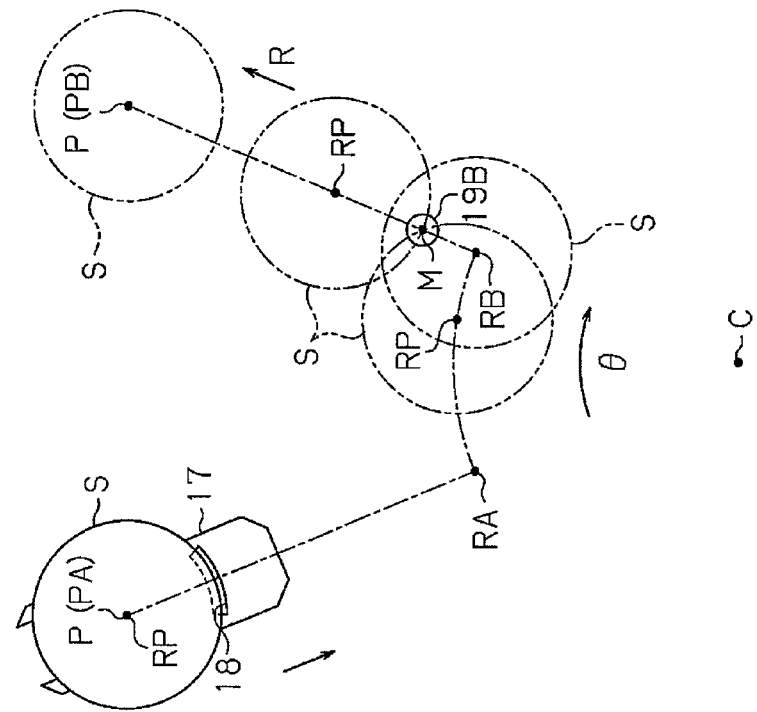
FIG. 4 is a schematic plan view illustrating a transfer process of a substrate in a first embodiment.
Figure 5:
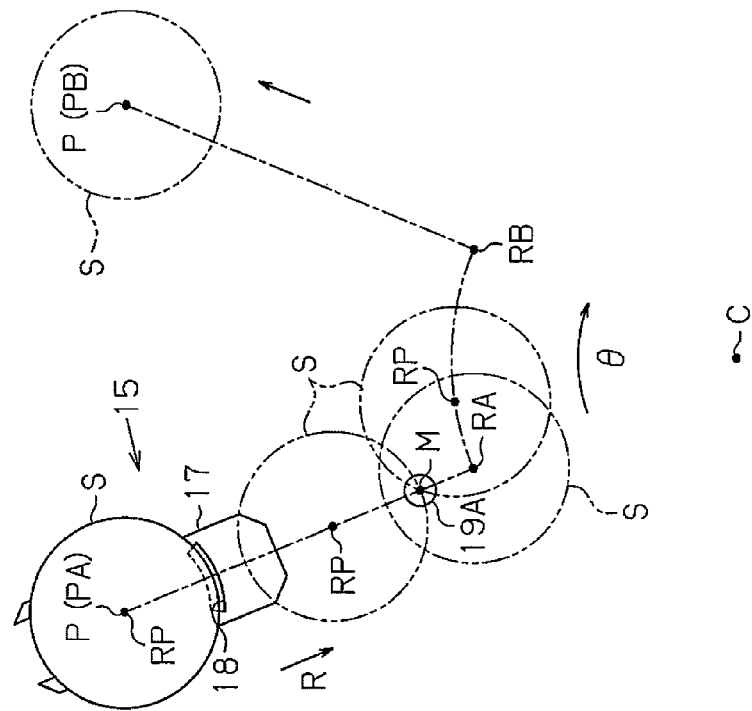
FIG. 5 is a schematic plan view illustrating a transfer process of a substrate in the first embodiment.

FIGS. 4 and 5 are plan views showing a transfer process of the substrate S. FIG. 4 shows the transfer process in relation with the movement start sensor 19A, and FIG. 5 shows the transfer process in relation with the movement end sensor 19B.

Referring to FIG. 4, when the transfer robot 15 transfers the substrate S from the initial point PA to the terminal point PB, the hand point RP is first moved fourth along a route extending on a straight line (radial direction R) connecting the initial point PA and the drawn point RA. Then, the hand point RP is pivoted along a route extending in the pivotal direction θ and connecting the drawn point RA and the delivery point RB.

In the route connecting the initial point PA and the drawn point RA, the transfer robot 15 detects the first movement start selection point with the movement start sensor 19A. Then, in the route extending in the pivotal direction θ and connecting the drawn point RA and the delivery point RB, the transfer robot 15 moves away the sensor point M of the movement start sensor 19A from the edge surface of the substrate S and switches the movement start sensor 19A from an activated state to a deactivated state. That is, in the route connecting the drawn point RA and the delivery point RB, the transfer robot 15 selects a single point (hereinafter simply referred to as a second movement start selection point) on the edge surface in the pivotal direction θ from the center of the substrate S and detects the coordinates of the second movement start selection point with the movement start sensor 19A.

In this manner, when transferring the substrate S from the initial point PA to the delivery point RB, the transfer robot 15 detects with the single movement start sensor 19A two different selection points, the first movement start selection point located in the radial direction R and the second movement start selection point located in the pivotal direction θ.

Referring to FIG. 5, the hand point RP is pivoted along a route extending in the pivotal direction θ connecting the drawn point RA and the delivery point RB. Then, the hand point RP moves fourth along a route extending in the radial direction R connecting the delivery point RB and the terminal point PB.

During this movement, in the route of the pivotal direction θ connecting the drawn point RA and the delivery point RB, the transfer robot 15 moves the sensor point M of the movement end sensor 19B from the edge surface of the substrate S to a region in the substrate S to switch the movement end sensor 19B from a deactivated state to an activated state. That is, in the route θ connecting the drawn point RA and the delivery point RB, the transfer robot 15 selects another single point (hereinafter simply referred to as a second movement end selection point) on the edge surface in the pivotal direction θ from the center of the substrate S and detects the coordinates of the second movement end selection point with the movement end sensor 19B. Then, in the route connecting the delivery point RB and the terminal point PB, the transfer robot 15 detects the first movement end selection point with the movement end sensor 19B.

As a result, when transferring the substrate S from the initial point PA to the terminal point PB, the transfer robot 15 uses the single movement end sensor 19B to detect two different selection points, the first movement end selection point located in the radial direction R and the second movement end selection point located in the pivotal direction θ.

Figure 6:
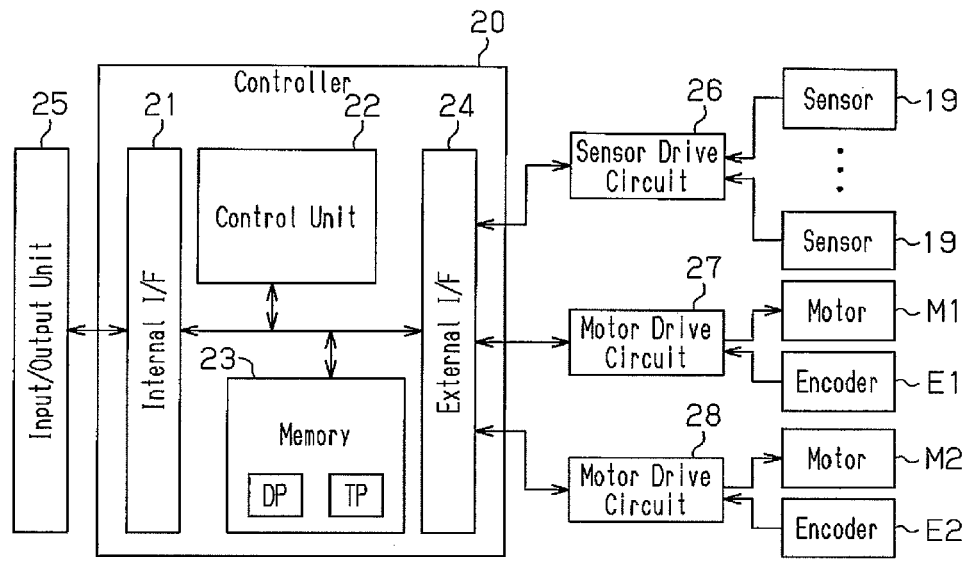
FIG. 6 is a schematic electric block circuit diagram of the substrate transfer apparatus shown in FIG. 1.

The electric structure of the fabrication apparatus 10 will now be described. FIG. 6 is an electric block circuit diagram showing the electric structure of the fabrication apparatus 10.

Referring to FIG. 6, a controller 20 executes with the fabrication apparatus 10 various types of processing operations, such as a transfer process for the substrates S or film formation processing of the substrates S. The controller 20 includes an internal I/F 21, which receives various types of control signals, and a control unit 22, which executes various types of calculations. Further, the controller 20 includes a memory 23, which stores various types of data and various types of control programs, and an external I/F 24, which outputs various types of signals.

The memory 23 stores data taught to the transfer robot 15 in relation with the polar coordinates of each transfer point P and the polar coordinates of each sensor point M as point data DP. Further, the memory 23 corrects the transfer position of the substrate S based on the detection results of the first movement start selection point and second movement start selection point or the detection results of the first movement end selection point and second movement end selection point. The memory 23 also stores a transfer program TP, which is for executing a transfer process of the substrates S.

The control unit 22 executes a transfer process for the substrates S in accordance with the transfer program TP. That is, referring to FIG. 4, when the transfer robot 15 transfers a substrate S from the initial point PA to the terminal point PB, the control unit 22 outputs a control signal to move the hand point RP straight ahead along the route connecting the initial point PA and the drawn point RA. Then, the control unit 22 outputs a control signal to pivot the hand point RP along the route in the pivotal direction θ connecting the drawn point RA and the delivery point RB. Further, the control unit 22 outputs a control signal to move the hand point RP straight ahead along the route in the pivotal direction θ connecting the delivery point RB and the terminal point PB.

When the movement start sensor 19A detects the first movement start selection point and the second movement start selection point, the control unit 22 calculates the position of the arm 16 based on the number of steps of the motors M1 and M2 and calculates the present polar coordinates of the hand point RP for each position, that is, the polar coordinates of two different hand points RP. The control unit 22 refers to the polar coordinates of the sensor point M of the movement start sensor 19A and converts the polar coordinates of the calculated hand point RP to planar coordinates, the origin point of which is the sensor point M. Then, the control unit 22 calculates the center coordinates of a circle, which has the same diameter as the substrate and passes by two different hand points RP, as a substrate center. There may be two circles that pass by two hand points RP. In such a case, the control unit 22 selects the center coordinates of the circle that is closer to the sensor point M of the movement start sensor 19A as the substrate center.

The control unit 22 inversely converts displacement of the sensor point M as viewed from the substrate center into polar coordinates to combine the displacement with the polar coordinates of the delivery point RB and obtain the polar coordinates of the corrected delivery point RB. Before the movement end sensor 19B detects the second movement end selection point, the control unit 22 calculates the position of the arm 16 in correspondence with the corrected delivery point RB. Then, the control unit 22 calculates and outputs the number of steps of the motors M1 and M2 corresponding to the position of the arm 16. As a result, the control unit 22 moves the hand point RP toward the corrected delivery point RB before the movement end sensor 19B detects the second movement end selection point.

Further, when the movement end sensor 19B detects the first movement end selection point and the second movement end selection point, the control unit 22 calculates the position of the arm 16 based on the number of steps of the motors M1 and M2 and calculates the present polar coordinates of the hand point RP for each position, that is, the polar coordinates of two different hand points RP. The control unit 22 refers to the polar coordinates of the sensor point M of the movement end sensor 19B and converts the polar coordinates of the calculated hand point RP to planar coordinates, the origin point of which is the sensor point M. Then, the control unit 22 calculates the center coordinates of a circle, which has the same diameter as the substrate and passes by two different hand points RP, as a substrate center. There may be two circles that pass by two hand points RP. In such a case, the control unit 22 selects the center coordinates of the circle that is closer to the sensor point M of the movement end sensor 19B as the substrate center.

The control unit 22 inversely converts displacement of the sensor point M as viewed from the substrate center into polar coordinates to combine the displacement with the polar coordinates of the terminal point PB and obtain the polar coordinates of the corrected terminal point PB. Before the substrate S is arranged at the terminal point PB, the control unit 22 calculates the position of the arm 16 in correspondence with the corrected terminal position PB. Then, the control unit 22 calculates and outputs the number of steps of the motors M1 and M2 corresponding to the position of the arm 16. As a result, the control unit 22 moves the hand point RP toward the corrected terminal point PB before the substrate is arranged at the terminal point PB.

The controller 20 is connected to an input/output unit 25 via the internal I/F 21. The input/output unit 25, which includes various types of operation switches such as an activation switch and a deactivation switch, provides the controller 20 with data that is used for the various types of processing operations performed by the fabrication apparatus 10. For example, the input/output unit 25 provides the controller 20 with data related to the transfer conditions of the substrates S, such as the size of the substrates S, the quantity of the substrates S, and the initial point PA and terminal point PB determined for each substrate S. Furthermore, the input/output unit 25 includes a display unit, such as a liquid crystal display, and displays the processing state of the transfer process performed by the controller 20. The controller 20 receives various types of data that is provided from the input-output unit 25 and performs the transfer process of the substrates S under the transfer conditions corresponding to the received data.

The controller 20 is connected via the external I/F to a sensor drive circuit 26 and two motor drive circuits 27 and 28.

The controller 20 provides the sensor drive circuit 26 with a sensor drive control signal. The sensor drive circuit 26 drives each sensor 19 in response to the sensor drive control signal, detects the activation/deactivation state of each sensor 19, and provides the controller 20 with the detection results. The sensor drive circuit 26, for example, detects the activation/deactivation state of the movement start sensor 19A and provides the controller 20 with a signal indicating whether or not the movement start sensor 19A detected the first movement start selection point or whether or not the movement start sensor 19A detected the second movement start selection point. Further, the sensor drive circuit 26, for example, detects the activation/deactivation state of the movement end sensor 19B and provides the controller 20 with a signal indicating whether or not the movement end sensor 19B detected the first movement end selection point or whether or not the movement end sensor 19B detected the second movement end selection point.

The controller 20 provides the motor drive circuits 27 and 28 with first and second motor drive control signals, respectively. The motor drive circuit 27 is connected to a motor M1 and an encoder E1, and the motor drive circuit 28 is connected to a motor M2 and an encoder E2. In response to the corresponding motor drive control signal, the motor drive circuits 27 and 28 produce forward rotation or reverse rotation with the corresponding motors M1 and M2 and calculate the movement amount and movement direction of the hand point RP based on detection signals from the corresponding encoders E1 and E2.

A process for transferring the substrates S with the semiconductor device fabrication apparatus 10 will now be discussed.

First, a substrate S is set in a cassette 12a that is arranged in an LL chamber 12. In this state, the center of the substrate S is not positioned in correspondence with the transfer point P of the LL chamber 12 and thereby displaced from the transfer point P of the LL chamber 12.

Then, the controller 20 is provided via the input/output unit 25 with data related to the transfer conditions of the substrate S and also provided with a signal for starting substrate processing. As a result, the control unit 22 (controller 20) reads the transfer program from the memory 23 and starts the transfer process of the substrate S in accordance with the transfer program.

During the transfer process of the substrate S, the controller 20 transfers the substrate S from the transfer point P (initial point PA) in the LL chamber 12 to the transfer point P (terminal point PB) in a processing chamber 13 with the transfer robot 15. More specifically, the controller 20 drives the motor drive circuits 27 and 28 to move the hand point RP (i.e., the hand 17) straight ahead along a route in the radial direction R connecting the initial point PA and the drawn point RA. Subsequently, the controller 20 drives the motor drive circuits 27 and 28 and pivots the hand point RP along a route in the pivotal direction θ connecting the drawn point RA and the delivery point RB. Further, the controller 20 drives the motor drive circuits 27 and 28 to move the hand point RP straight ahead along a route in the radial direction R connecting the delivery point RB and the terminal point PB.

During the transfer process, the controller 20 drives the sensor drive circuit 26 and determines whether or not the movement start sensor 19A has detected the first movement start selection point and the second movement start selection point. At a timing in which the movement start sensor 19A detects the first movement start selection point and the second movement start selection point, the controller 20 refers to the movement amount and movement direction of the hand point RP input to the motor drive circuits 27 and 28 to calculate the present position of the arm 16 and calculate the polar coordinates of the hand point RP. When calculating the polar coordinates of each hand point RP, the controller 20 uses the polar coordinates of each hand point RP to calculate the substrate center and move the hand point RP to the corrected delivery point RB.

Further, the controller 20 drives the sensor drive circuit 26 and determines whether the movement end sensor 19B has detected the first movement end selection point and the second movement end selection point. At a timing in which the movement end sensor 19B detects the first movement end selection point and the second movement end selection point, the controller 20 refers to the movement amount and movement direction of the hand point RP input to the motor drive circuits 27 and 28 to calculate the present position of the arm 16 and calculate the polar coordinates of the hand RP. When calculating the polar coordinates of each hand point RP, the controller 20 uses the polar coordinates of each hand point RP to calculate the substrate center and move the hand point RP to the corrected terminal point PB.

The first embodiment of the substrate transfer apparatus has the advantages described below.

(1) The movement start sensor 19A detects the first movement start selection point, which is set on the edge surface located in the radial direction R as viewed from the center of the substrate S, and the second movement start selection point, which is set on the edge surface located in the pivotal direction θ as viewed from the center of the substrate S. The controller 20 calculates the substrate center based on the detection results of the movement start sensor 19A and transfers the substrate S to the corrected delivery point RB with the hand 17.

Accordingly, the controller 20 transfers the substrate S with the transfer robot 15 to the corrected delivery point RB while calculating the center of the substrate S during the transfer process using the single sensor point M, that is, the single movement start sensor 19A. This minimizes the quantity of the sensors that detect the position of the substrate S and thereby lowers costs.

In addition, at the single sensor point M, the first movement start selection point, which is located in the radial direction R, and the second movement start selection point, which is located in the pivotal direction θ, are detected. Thus, in comparison with when the sensor point M and the selection point are arranged in the same direction, the center of the substrate S may be calculated with a higher accuracy.

(2) The hand 17 moves along a route in the radial direction R in which the first movement start selection point passes by the sensor point M and a route in the pivotal direction θ in which the second movement start selection point passes by the sensor point M. Accordingly, the movement start sensor 19A detects the first movement start selection point when the hand 17 moves straight ahead along a route in the radial direction R and detects the second movement start selection point when the hand 17 pivots along a route in the pivotal direction θ. Thus, the movement start sensor 19A detects the first movement start selection point located in the radial direction R and the second movement start selection point located in the pivotal direction θ within a shorter route.

(3) The movement end sensor 19B detects the second movement end selection point, which is set on the edge surface located in the pivotal direction θ from the center of the substrate S, and the first movement end selection point, which is set on the edge surface located in the radial direction R from the center of the substrate S. The controller 20 calculates the substrate center based on the detection results of the movement end sensor 19B and transfers the substrate S with the hand 17 to the corrected terminal point PB.

Accordingly, the two sensors corresponding to the initial point PA and the terminal point PB detect three different points on the edge surface. Thus, the center of the substrate S may be detected with higher accuracy. The quantity of the sensors arranged at each of the transfer points P of the substrate (the initial point PA or the terminal point PB) may be one. This minimizes the quantity of the sensors that detect the position of the substrate at each transfer point P and thereby lowers costs.

Second Embodiment

Figure 7:
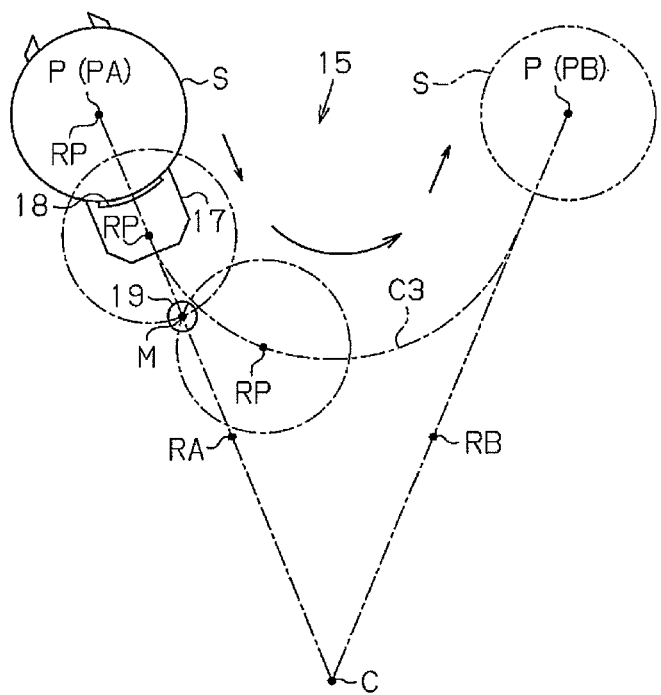
FIG. 7 is a schematic plan view illustrating a transfer process of a substrate in a second embodiment.

A second embodiment of a substrate transfer apparatus according to the present invention will now be discussed. In the second embodiment, the route of a substrate S is changed from the first embodiment. This change will hereafter be discussed in detail. FIG. 7 is a plan view showing a transfer process of the substrate S in the second embodiment.

In FIG. 7, to shorten the route between the initial point PA and the terminal point PB when transferring the substrate S from the initial point PA to the terminal point PB, the transfer robot 15 generates a curved action of the hand point RP along an arcuate route (hereinafter referred to as the shortened route C3), which is curved so as to bulge manner toward the center point C. The shortened route C3 connects in an arcuate manner an intermediate part of a straight line connecting the initial point PA and the drawn point RA to an intermediate part of a straight line connecting the delivery point RB and the terminal point PB.

In the route along the radial direction R connecting the initial point PA and the drawn point RA, the sensor point M (i.e., laser beam) of the movement start sensor 19A is moved from the edge surface of the substrate S into a region within the substrate S so as to switch the movement start sensor 19A from a deactivated state to an activated state. That is, in the route of a straight line connecting the initial point PA and the drawn point RA, the transfer robot 15 selects a single point (i.e., the first movement start selection point) on the edge surface located in the radial direction R as viewed from the center of the substrate S and detects the polar coordinates of this point with the movement start sensor 19A. Then, in the shortened route C3, the transfer robot moves the sensor point M of the movement start sensor 19A away from the edge surface of the substrate S. That is, the transfer robot 15 selects a single point (i.e., the second movement start selection point) on the edge surface substantially located in the generally pivotal direction θ as viewed from the center of the substrate S and detects the polar coordinates of this point with the movement start sensor 19A.

As a result, when transferring the substrate S along the shortened route C3 from the initial point PA to the delivery point RB, the transfer robot 15 detects with the single movement start sensor 19A two different points, namely, the first movement start selection point located in the radial direction R and the second movement start selection point substantially located in the generally pivotal direction θ.

The control unit 22 performs an interpolation process (e.g., linear interpolation and circular interpolation) in predetermined interpolation cycles on the route between the initial point PA and the terminal point PB to sequentially calculate the polar coordinates of a plurality of interpolation points in the route. Based on the coordinates of the plurality of interpolation points interpolating the space between the initial point PA and the terminal point PB, the control unit 22 sequentially calculates the position of the arm 16 and sequentially calculates the number of steps of the motors M1 and M2 corresponding to the position of the arm 16. The control unit 22 sends a signal corresponding to the number of calculated steps to the motor drive circuits 27 and 28 to move the hand point RP along the straight route and the shortened route. Then, before the substrate S is arranged at the terminal point PB, the control unit 22 moves the hand point RP toward the corrected terminal point PB.

As a result, even when a route is shortened to the shortened route C3, two different points, namely, the first movement start selection point located in the radial direction R and the second movement start selection point substantially located in the generally pivotal direction θ, are detected with the single movement start sensor 19A. Further, the center of the substrate S is arranged in correspondence with the terminal point PB. The operation of the movement start sensor 19A using the shortened route C3 has been discussed above. The same applies to the movement end sensor 19B.

Third Embodiment

Figure 8:
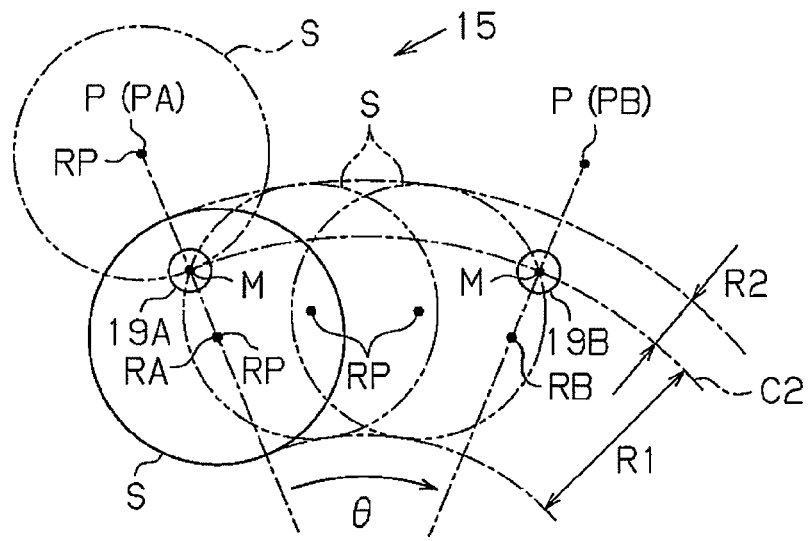
FIG. 8 is a schematic plan view illustrating a transfer process of a substrate in a third embodiment.
Figure 9:
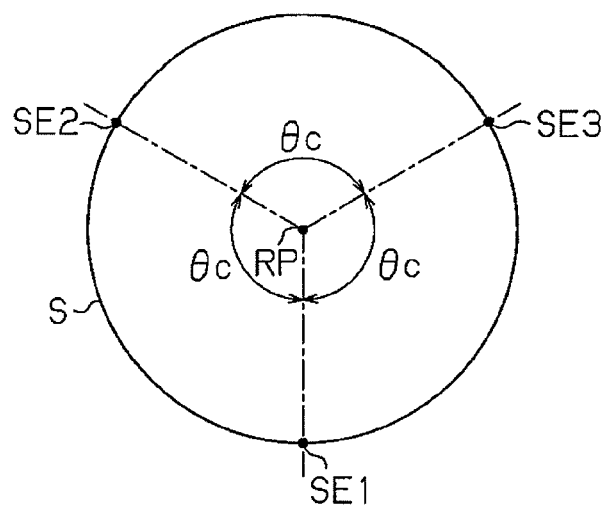
FIG. 9 is a plan view showing a plurality of selection points in a third embodiment.

A substrate transfer apparatus according to a third embodiment of the present invention will now be discussed. In the third embodiment, the route of a substrate S is changed from the first embodiment. This change will hereafter be discussed in detail. FIGS. 8 and 9 is a plan view showing a transfer process of the substrate S in the third embodiment.

Referring to FIG. 8, each sensor 19 is arranged along a straight line connecting the corresponding transfer point P and the center point C. When the hand point RP is located at the drawn point RA or the delivery point RB, the sensor point M of each sensor 19 divides the inner diameter of the substrate S along the radial direction by a predetermined ratio.

The part of the inner diameter of the substrate S located toward the center point C from the sensor point M is referred to as a first portion R1. Further, the remaining part of the inner diameter of the substrate S located toward the transfer point P from the sensor point M is referred to as a second portion R2. The distance from the drawn point RA or delivery point RB to the center point C is sufficiently large with respect to the diameter of the substrate S.

When moving the substrate S from the initial point PA to the terminal point PB with the hand 17, the control unit 22 moves the hand point RP along a route connecting the initial point PA and the drawn point RA and then along a route in the pivotal direction θ connecting the drawn point RA and the delivery point RB. Further, the control unit 22 moves the hand point RP along a route in the radial direction connecting the delivery point RB and terminal point PB.

During this period, the control unit 22 sets the drawn point RA or the delivery point RB in accordance with the sensor point M of the movement start sensor 19A or the sensor point M of the movement end sensor 19B so that the ratio of the first portion R1 and the second portion becomes 3:1. In other words, the control unit 22 draws the hand point RP toward the center point C until the sensor point M of the movement start sensor 19A or the sensor point M of the movement end sensor 19B is positioned so that the ratio of the first portion R1 and second portion R2 becomes 3:1.

When transferring the substrate S from the initial point PA to the drawn point RA, the control unit 22 selects a single point (first movement start selection point SE1) located in the radial direction R from the center of the substrate S and detects its polar coordinates with the movement start sensor 19A. Further, when transferring the substrate S from the drawn point RA to the delivery point RB, the control unit 22 selects a single point (second movement start selection point SE2) located in the pivotal direction θ from the center of the substrate S and detects its polar coordinates with the movement start sensor 19A. Additionally, in a route connecting the drawn point RA and the delivery point RB, the control unit 22 selects the other single point (second movement end selection point SE3) on the edge surface located in the pivotal direction θ from the center of the substrate S and detects its polar coordinates with the movement end sensor 19B.

In this state, referring to FIG. 9, the ratio of the first portion R1 and the second portion R2 is 3:1. Thus, center angles θc, which are determined by the hand point RP and two points among the first movement start selection point SE1, the second movement start selection point SE2, and the second movement end selection point SE3, are each generally 120°. That is, the first movement start selection point SE1, the second movement start selection point SE2, and the second movement end selection point SE3 are arranged at generally equal intervals on the edge surface of the substrate S.

Since the selection points are arranged at equal intervals on the edge surface, deviations may be eliminated from the calculation results of the substrate center. Accordingly, the transfer accuracy of the substrates S may be further improved.

The above embodiments may be practiced in the forms described below.

In the first embodiment, eight sensors 19 are arranged along the detection circle C2. Instead, just one sensor 19 may be arranged on the detection circle C2. Accordingly, in the present invention, the quantity of the sensors 19 is not restricted by the quantity of the transfer points P. In the present invention, when a substrate S is transferred from an originating transfer point P to a destined transfer point P, at least two selection points set on the edge surface of the substrate S are detected with a single sensor point M, and the substrate position is corrected based on the two detection points.

In each of the above-described embodiments, the sensor 19 is formed by the emission unit 19s and the light reception unit 19d, which are arranged on opposite sides of a transfer surface. However, the present invention is not limited in such a manner. For example, the sensor 19 may be formed by an emission unit 19s and light reception unit 19d, which are arranged at an upper side of a transfer surface, and a reflection unit, which is arranged at a lower side of a transfer surface to reflect the laser beam from the emission unit 19s toward the light reception unit 19d.

In each of the above-described embodiments, the two LL chambers 12 and the six processing chambers 13 are connected to the two LL chambers 12. However, the present invention is not limited in such a manner, and the quantity of the LL chambers 12 may be one or three or more. Further, the quantity of the processing chambers 13 may be five or less or seven or more. In this manner, the present invention does not restrict the quantity of the chambers connected to the core chamber 11.

What is claimed is:

1. A substrate transfer apparatus for transferring a substrate between a core chamber and a peripheral chamber, wherein the core chamber is connected to a first chamber and a second chamber, each of the first and second chambers being arranged as the peripheral chamber, the substrate transfer apparatus comprising:
   a transfer robot arranged in the core chamber and including an arm, wherein the arm is capable of extending/drawing and pivoting a hand for carrying the substrate so as to transfer the substrate from the first chamber serving as an initial point to the second chamber serving as a terminal point;
   a first sensor which detects an edge surface of the substrate at a first detection point associated with the initial point, wherein the first sensor is arranged at a position that the edge surface of the substrate passes by when the hand is extended/drawn between the core chamber and the first chamber and that the edge surface of the substrate passes by when the hand is pivoted in the core chamber;
   a second sensor which detects the edge surface of the substrate at a second detection point associated with the terminal point; and
   a control unit which controls the first sensor, the second sensor, and the transfer robot, wherein the control unit:
      sets a movement route for the hand so that a first selection point, located on the edge surface of the substrate in a first direction in which the hand is extended/drawn, and a second selection point, located on the edge surface of the substrate in a second direction in which the hand is pivoted, pass by the first detection point, and a third selection point, located on the edge surface of the substrate in the second direction, passes by the second detection point;
      drives the transfer robot and moves the hand from the initial point along the movement route;
      detects the first selection point and the second selection point with the first sensor at the first detection point and then detects the third selection point at the second detection point with the second sensor;
      calculates the location of the center of the substrate based on the detection result of the first and second sensors; and
      transfers the substrate to the terminal point based on the calculated location of the center of the substrate, and
   wherein the control unit sets the movement route for the hand so that the first selection point, the second selection point, and the third selection point are arranged at equal intervals on the edge surface of the substrate.

2. The substrate transfer apparatus according to claim 1, wherein:
   the hand includes a reference position set thereon;
   the hand is capable of supporting a calibration substrate, which has a center through which a through hole extends, with the through hole corresponding to the reference position; and
   the control unit detects the through hole with the first sensor by extending/drawing and pivoting the hand and associates the first detection point and the reference position.

3. The substrate transfer apparatus according to claim 1, wherein the control unit:
   sets the movement route for the hand so that a third selection point, located on the edge surface of the substrate in the second direction, and a fourth selection point, located on the edge surface of the substrate in the first direction, pass by the second detection point;
   detects the first selection point and the second selection point at the first detection point with the first sensor and then detects the third selection point and the fourth selection point at the second detection point with the second sensor;
   calculates the location of the center of the substrate based on the detection results of the first and second sensors; and
   transfers the substrate to the terminal point based on the calculation result.

4. The substrate transfer apparatus according to claim 3, wherein:
   the hand includes a reference position set thereon;
   the hand is capable of supporting a calibration substrate, which has a center through which a through hole extends, with the through hole corresponding to the reference position; and
   the control unit detects the through hole with the first sensor by extending/drawing and pivoting the hand and associates the first detection point and the reference position.

5. The substrate transfer apparatus according to claim 1, wherein the control unit sets the movement route for the hand so as to include a route in the first direction in which the first selection point passes by the first detection point and a route in the second direction in which the second selection point passes by the first detection point.

6. The substrate transfer apparatus according to claim 5, wherein:
   the hand includes a reference position set thereon;
   the hand is capable of supporting a calibration substrate, which has a center through which a through hole extends, with the through hole corresponding to the reference position; and the control unit detects the through hole with the first sensor by extending/drawing and pivoting the hand an associates the first detection point and the reference position.

7. The substrate transfer apparatus according to claim 5, wherein the control unit:
   sets the movement route for the hand so that a third selection point, located on the edge surface of the substrate in the second direction, and a fourth selection point, located on the edge surface of the substrate in the first direction, pass by the second detection point;
   detects the first selection point and the second selection point at the first detection point with the first sensor and then detects the third selection point and the fourth selection point at the second detection point with the second sensor;
   calculates the location of the center of the substrate based on the detection results of the first and second sensors; and
   transfers the substrate to the terminal point based on the calculation result.

8. The substrate transfer apparatus according to claim 7, wherein:
   the hand includes a reference position set thereon;
   the hand is capable of supporting a calibration substrate, which has a center through which a through hole extends, with the through hole corresponding to the reference position; and
   the control unit detects the through hole with the first sensor by extending/drawing and pivoting the hand and associates the first detection point and the reference position.

9. A substrate transfer apparatus for transferring a substrate from an initial point to a terminal point, the substrate transfer apparatus comprising:
   a transfer robot including an arm, which has a pivot shaft, and a hand, which is connected to the arm and which supports the substrate, with the transfer robot being capable of extending/drawing the hand along a radial direction of the pivot shaft and being capable of pivoting the hand about the pivot shaft;
   a first sensor which detects an edge surface of the substrate at a first detection point associated with the initial point;
   a second sensor which detects the edge surface of the substrate at a second detection point associated with the terminal point; and
   a control unit which controls the first sensor, the second sensor, and the transfer robot;
   wherein the control unit:
      sets a route for the hand so that a first selection point, located on the edge surface of the substrate in a first direction in which the hand is extended/drawn, and a second selection point, located on the edge surface of the substrate in a second direction in which the hand is pivoted, pass by the first detection point and a third selection point, located on the edge surface of the substrate in the second direction, passes by the second detection point;
      drives the transfer robot and moves the hand from the initial point along the route;
      detects the first selection point and the second selection point with the sensor at the first detection point, and then detects the third selection point at the second detection point with the second sensor;
      calculates the location of the center of the substrate based on the detection result of the first and second sensors; and
      transfers the substrate to the terminal point based on the calculation result, and
   wherein the control unit sets the movement route for the hand to that the first selection point, the second selection point, and the third selection point are arranged at equal intervals on the edge surface of the substrate.

10. The substrate transfer apparatus according to claim 9, wherein:
    the hand includes a reference position set thereon;
    the hand is capable of supporting a calibration substrate, which has a center through which a through hole extends, with the through hole corresponding to the reference position; and
    the control unit detects the through hole with the first sensor by extending/drawing and pivoting the hand and associates the first detection point and the reference position.

* * * * *